United States Patent [19]

Lemelson

[11] Patent Number: 4,702,808

[45] Date of Patent: Oct. 27, 1987

[54] CHEMICAL REACTION APPARATUS AND METHOD

[76] Inventor: Jerome H. Lemelson, 85 Rector St., Metuchen, N.J. 08840

[21] Appl. No.: 712,411

[22] Filed: Mar. 15, 1985

Related U.S. Application Data

[63] Continuation-in-part of Ser. No. 592,968, Mar. 23, 1984, Pat. No. 4,666,678, and a continuation of Ser. No. 737,446, Oct. 29, 1976, which is a continuation of Ser. No. 165,445, Jul. 26, 1971, abandoned, and a continuation-in-part of Ser. No. 12,082, Feb. 17, 1970, abandoned, which is a continuation-in-part of Ser. No. 710,518, Mar. 5, 1968, Pat. No. 3,566,645, which is a continuation-in-part of Ser. No. 501,395, Oct. 22, 1965, Pat. No. 3,371,404, which is a continuation-in-part of Ser. No. 668,561, Jun. 27, 1957, abandoned.

[51] Int. Cl.⁴ ............................................. B01J 19/12
[52] U.S. Cl. .......................... 204/157.41; 204/157.42; 204/157.61; 204/157.62; 422/186
[58] Field of Search ................ 204/157.1 R, 157.1 L, 204/158 R, 158 L, 193, 157.41, 157.42, 157.62, 157.61; 422/186

[56] References Cited

U.S. PATENT DOCUMENTS 3,405,045 10/1968 Hoskins ........................ 204/158 L
3,528,897 9/1970 Scheiner ........................ 204/158 L
4,012,301 3/1977 Rich et al. ...................... 204/158 L Primary Examiner—Howard S. Williams

[57] ABSTRACT

This invention concerns an apparatus and method for reacting on matter, particularly to change its chemical properties and to create chemical reactions with respect to such matter by introducing the matter into a reaction chamber as one or more streams of particles, gas, liquid or plasma or a combination of such forms of matter and reacting on such matter by directing one or more beams of radiant energy, such as coherent light energy generated by a laser or a plurality of lasers wherein such radiant energy serves to initiate or complete the desired chemical reaction.

20 Claims, 12 Drawing Figures

CHEMICAL REACTION APPARATUS AND METHOD

CROSS REFERENCE TO RELATED APPLICATIONS

This is a continuation-in-part of Ser. No. 592,968 filed 3/23/84 now U.S. Pat. No. 4,666,678 and a continuation of Ser. No. 737,446 filed 10/29/76 which is a continuation of Ser. No. 05/165,445 filed 7/26/71, now abandoned and a continuation-in-part of Ser. No. 05/012,082 filed 2/17/70, now abandoned which is a continuation-in-part of Ser. No. 04/710,518 filed 3/5/68 now U.S. Pat. No. 3,566,645 which is a continuation-in-part of Ser. No. 04/501,395 filed 10/22/65 (now U.S. Pat. No. 3,371,404) which is a continuation-in-part of Ser. No. 03/668,561 filed 6/27/57 abandoned.

DESCRIPTION OF THE PRIOR ART

Before the making the instant invention, it was known to generate and effect chemical reactions in liquids and gases by such processes as combustion of such liquids and gases, by electrical ignition means, by radio frequency energy applied from an external source of same, by the injection and ignition of fuel, by electrical resistance heating and by heat transfer means energized from an external source. The prior art processes were all limited in their application and had various shortcomings. For example, combustion of reaction products is difficult to control and may be incomplete resulting in unwanted products of reaction. Combustion of fuel in the reaction zone may also contaminate the products of the chemical reaction.

SUMMARY OF THE INVENTION

This invention relates to chemical and physical reactions, particularly resulting from the intersection of one or more radiation beams with one or more chemicals, preferably in a fluent condition such as in a gaseous, liquid, vaporous or plasma state. The chemicals may be intermittently or continuously flowed along one or more given paths to a reaction zone and made to intersect each other at or before such reaction zone and are intersected by one or more radiation beams which serve to transfer radiant energy to such chemical or chemicals and to thereby affect a chemical reaction or reactions therewith. In a particular form of the invention, one or more solid particles may also be introduced into the reaction zone, either on a stream of one or more of the fluent chemical materials or otherwise and caused to react with the fluent chemical or chemicals in the presence of the beamed radiation. In a preferred form, the beam is generated by a laser or electron gun and contains substantial heat energy which may be utilized to affect or improve the chemical reaction. In another form, the beam may comprise a beam of molecular particles and may be combined with one or more additional beams to affect a particular chemical or physical reaction. In another form, one or more streams of a fluent chemical or chemicals are directed against a select area of the surface of a solid material, such as an article of manufacture or a chemical, and a chemical reaction is affected therebetween which involves a transfer of energy from the beam to the chemical or chemicals and the material of the work to melt, cut, vaporize, coat or otherwise affect the surface of the solid material.

Accordingly it is a primary object of this invention to provide a new and improved apparatus and method for reacting on a fluent material with radiation generated as one or more collimated beams of such radiation and directed into the fluent material.

Another object is to provide a new and improved chemical reaction apparatus and method involving a fluid or fluids and a high intensity beam of radiation wherein the radiation is caused to predeterminately intersect and react on the chemical or chemicals of the fluid.

Another object is to provide a chemical reaction apparatus which employs an intense light beam generated by a laser intersecting a material which is continuously or intermittently fed through a reaction zone.

Another object is to provide a method for effecting chemical reactions utilizing coherent light energy generated by a laser.

Another object is to provide a method for effecting chemical reactions utilizing a stream of electrons generated by an electron gun.

Another object is to provide a method for effecting a chemical reaction using radiation generated in two or more different forms and caused to intersect material to be reacted on thereby, either at the same location or at selected locations, one of which is downstream of the other.

Another object is to provide an apparatus and method for effecting a chemical reaction by causing two streams of fluent material to intersect in a reaction zone and directing a beam of intense radiant energy at or near said reaction zone to transfer at least a portion of such radiant energy to the intersecting fluid streams.

Another object is to provide a method for reacting on a stream of gaseous molecules which are controllably directed through a reaction zone of a reaction chamber with intense radiation in the form of a narrow beam of radiation intersecting said stream of gas molecules.

Another object is to provide a method for reacting on matter in the form of a free flowing stream of gaseous molecules by directing a beam of coherent radiation from a laser to intersect a predetermined location of said stream.

Another object is to provide a method for effecting chemical reactions with respect to matter flow as one or more free streams thereof through a reaction chamber by directing one or more beams of intense radiation generated by a laser or electron gun at one or more select locations along said stream.

Another object is provide a method for effecting chemical reactions by subjecting the molecules of gas in a free flowing stream to intense radiation sufficient to substantially raise the temperature of such molecules to a degree of excitation necessary to effect a chemical reaction with respect to such molecules.

Another object is provide a method for effecting chemical reactions between two or more different chemicals by mixing such chemicals as they flow as one or more streams thereof and by subjecting the resulting free stream of molecules to intense radiation, such as generated by a laser or electron gun.

Another object is to provide a method employing intense pulses of beam radiation to react on matter introduced into a reaction zone of a reaction chamber.

Another object is to provide a chemical reaction apparatus and method for reacting on fluid materials with intense radiation which, together with the flow of such matter, is controlled in its generation by a master controller or a computer.

With the above and such other objects in view as may hereinafter more fully appear, the invention consists of the novel systems and methods as will be more fully described and illustrated in the accompanying drawings but it is understood that changes and modifications may be resorted to which fall within the scope of the invention as claimed.

Figure 1:
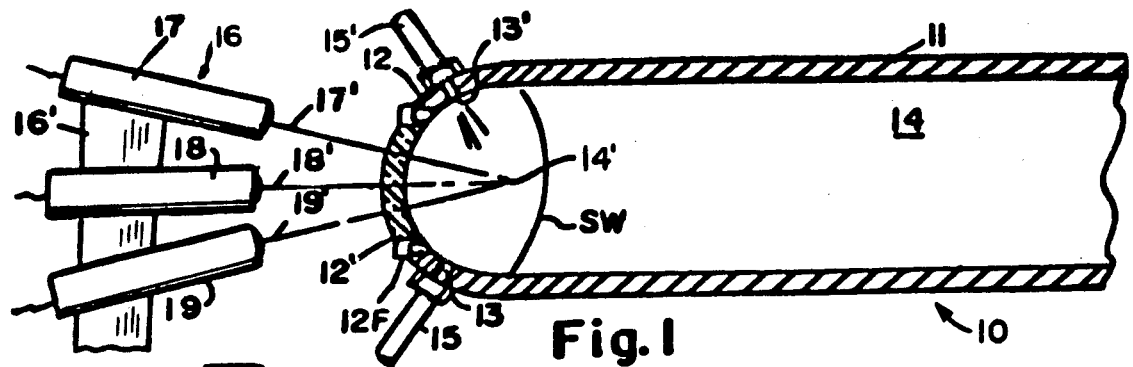
FIG. 1 is a side view with parts broken away and sectioned for clarity of a reaction apparatus showing at least a portion of a reaction chamber thereof and means situated outside of the reaction chamber for generating high temperatures and pressures including shock waves within the reaction chamber.

There is shown in FIG. 1 a reaction apparatus 10 operative for performing various operations on work-in-progress and having an elongated reaction chamber 11, which may also be spherical, with a head-end 12 at least a portion 12' of which is made of a light transmitting material, such as high temperature glass, quartz or transparent ceramic having the ability to withstand high temperatures and pressures. The entire reaction chamber may also be made of or lined with a high temperature ceramic material such as Pyroceram manufactured by the Corning Glass Works of Corning, N.Y. Disposed externally of the reaction chamber 11 on a mount supported preferably by the means supporting the chamber, are shown a plurality of radiant energy beam generating devices 17, 18 and 19, such as electron guns or lasers adapted to generate respective beams 17', 18' and 19' of intense coherent light energy, which are directed through different portions of the window 12' and aimed to converge on a defined small volume 14' within the chamber or to intersect at a point 14' within the chamber. One or all the beams may also be directed through small openings in the wall of the chamber, which may be two to one hundred times the diameter of the beam and may replace the transparent window. In the illustrated embodiment, the energy generated by each beam in heating the portion of the window through which it passes, is not sufficient to damage said window but the concentration of radiant energy from the plural beams at the working region or focal point 14' may be utilized to generate substanially higher temperatures in the working zone than would be generated by a single work processing beam which may necessarily be of such an intensity to destroy or damage the window 12'.

Where used herein, the term window may be construed to mean a transparent insert in the chamber wall or a small opening extending through the chamber wall through which the laser light beam or other form of radiant energy may pass to the interior of the chamber.

Thus with an arrangement of the type shown in FIG. 1 whereby a plurality of intense radiant energy beams are directed through respective different portions of a window and are converged to a focal volume, substantially higher temperatures may be provided at a reaction zone of a reaction chamber by means of radiant energy than would be possible by utilizing a single beam of coherent laser light.

The arrangement illustrated in FIG. 1 may be utilized to perform a number of different operations on matter disposed within the reaction chamber. In the arrangement illustrated in FIG. 1, the reaction chamber 11 is employed as a shock tube in which one or a plurality of shock waves are generated by means of intense radiant energy directed into the tube, as described, and travel down the tube to react on matter therein or matter disposed beyond the far end of the tube. Certain of the operations which may be performed by such a shock tube are described in application Ser. Nos. 668,561 now abandoned and 501,393 now U.S. Pat. No. 3,371,404.

If the lasers 17, 18 and 19 are simultaneously activated whereby each generates an intense pulse of light energy in phase with each other, intense heating of matter in the focal volume 14' will be effected near the head end of the chamber and gas or liquid molecules disposed within such focal volume will be rapidly heated and expand rapidly outwardly therefrom to form a shock wave SW, a portion of which shock wave will immediately travel down the reaction chamber while the remaining portion of the shock wave will reflect off the side and end wall of the chamber and will also travel down the chamber react on fluid therein. Working and/or driving fluid or other fluent material may be injected through or near the head end 12 of the chamber, either continuously or intermittently in phase with the operation of the lasers to produce select results or reactions. Notations 15 and 15' refer to inlet ducts which are respectively connected to openings 13 and 13' in the end wall 12 of the reaction chamber 11. Fluent material introduced therethrough as well as through other portions (not shown) of the wall of the reaction chamber, may be utilized to serve as the medium in which the shock waves are generated and/or to be reacted on by the shock waves directed therethrough. Gas, vapor, particulate material or solid material may be introduced through one or more inlets to the reaction chamber 11 at a predetermined rate of flow to effect predetermined chemical reactions for analysis or the production of new compounds, as described in said application Ser. Nos.

668,561 (abandoned) and 501,395 (now U.S. Pat. No. 3,371,404).

The reaction apparatus 10 illustrated in FIG. 1 may also be utilized to generate a reaction force. For example, if a gaseous or vaporous fuel is injected through the inlet lines 15 and 15', it may be rapidly expanded and exploded within the reaction chamber to cause the device to be operative as an intermittent rocket or pulse jet. If a piston is disposed within the reaction chamber and is free to slide back and forth therein, the rapid heating and, explosion and expansion of gases injected into the volume 14 may be utilized to drive the piston to either directly perform work or indirectly. The chamber 11 may thus be one of a plurality of cylinders forming part of an internal combustion engine of conventional piston-cylinder arrangement which is operative to drive a shaft or other suitable mechanical means. The hot expanding gases generated by the direct rapid heating thereof by the laser beams or the explosion of combustible mixtures within the reaction chamber 14 may also be employed to operate a turbine or other high-temperature engine. The heat and pressures generated by the shock waves or explosions resulting from directing the intense radiant energy beams through the window 12' may also be utilized to effect physical as well as chemical changes in matter such as the shock wave or explosion bonding of two or more sheets of metal together, the cladding of two sheets together or the securing of a particulate material disposed in the surface of the sheet placed on the path of the shock waves, or the forming of one or more sheets against a die aligned with the far end of the reaction chanmber 11, as described in said parent applications. The apparatus of FIG. 1 may also be utilized to effect chemical reactions involving one or more gases or fluent materials disposed within the volume 14 surrounded by the chamber. It is noted that the fixture 16 on which the multiple lasers 17, 18 and 19 are mounted, may contain means for adjusting or predeterminately varying the attitude of one or more of the lasers and may include means for adjustably mounting or supporting the combustion chamber 11 with respect to the lasers to permit the location of the focal volume 14 to be adjustably changed or varied during a cycle of operations. If the apparatus of FIG. 1 is used to effect the welding of a work piece disposed within a chamber 11, then a plurality of lasers may be individually varied in attitude by respective servo motors controlled by control signals from a master controller, such as a computer, to direct the respective beams of intense coherent light to permit them to simultaneously interact the same or different areas of the work piece for performing the same or different welding or other operations on the work disposed within the chamber.

Figure 2:
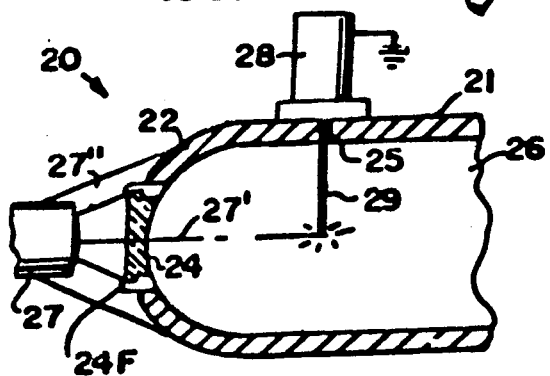
FIG. 2 is a side view with parts broken away and sectioned for clarity of a modified form of the apparatus of the type shown in FIG. 1.

In FIG. 2 is shown a modified form of reaction chamber apparatus 20 employing a totally enclosed reaction chamber 21 having a head end 22 containing an opening 23 therein in which is disposed a window 24 of the type described, through which window a light beam 27' is directed from a source 27, such as a laser. A light beam 27' is shown intersecting a wire element 29 disposed within the volume 26 surrounded by the reaction chamber and is operative to vaporize said wire to provide metal vapor within the chamber volume 26. Accordingly, the apparatus 20 may perform one or more of a plurality of functions involving the use of a vaporized metal or other material. For example, the reaction chamber 21 may be part of a vacuum metallizing chamber containing objects (not shown) situated therein to become vacuum metallized when the metal vapor, such as aluminum, is formed by the action of the beam, and flows to the surface of the object. A feeding device 28 for the wire 29 is situated exterior of the chamber 21 and feeds the wire 29 through an opening 25 in the wall of 21 at a controlled speed. The wire may be positively electrically charged to effect suitable flow of the vapor to the articles to be coated, which may be negatively charged. The device 28 contains a coil supply of such wire and a servo motor for predeterminately feeding same to the beam 27' passed through window 24. Provided, but not shown in FIG. 2, is a suitable means for evacuating air from the interior of chamber 21, when necessary, to effect vacuum metallizing or other production functions employing material evaporated from the wire or rod 29 fed to the beam.

The device 20 of FIG. 2 may also be utilized as a source of vaporous metals or other materials for use in plasma apparatus such as a magneto hydrodynamic generators Accordingly, suitable means may be provided for predeterminately conveying or otherwise removing the vaporous material from the chamber 21 to provide same at the volume where it is to be utilized.

Figure 3:
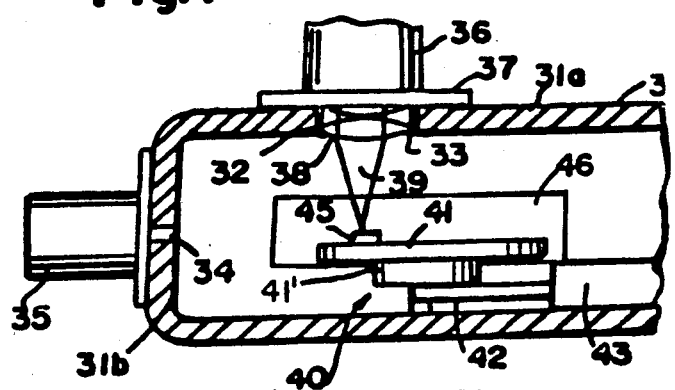
FIG. 3 is a side cross sectional view of a reaction chamber and means for movably supporting work therein to receive radiant energy from an external source.

In FIG. 3 is shown a modified form of high temperature apparatus 30 including a reaction chamber 31 defining a totally enclosed internal volume 31V in which is disposed a manipulation apparatus 40 for one or more units of work 45 to be operated on by an intense radiation beam directed into the volume 31V from an external source of energy supported in a housing 36. An opening 32 in the side wall 31a of the housing 31 has a frame or mount 33 for a focusing lens 38 which is sealingly secured therein in alignment with the output of a source of intense light energy provided in a housing 36, the flange of which lens is secured and sealed to the side wall 31a. Light from the source within housing 36 is directed through the lens 38 and focused on a work piece 45 which is mounted on a rotatable base 41 supported on a mount 41'. A program controlled motor (not shown) is employed for predeterminately rotating said base to predeterminately locate one or more work pieces on the table 41 with respect to the focal point of light 39 passed through the lens 38. The base 41' is secured to arm 42 which is the shaft of a lineal actuator 43 which is also automatically controlled to move the assembly supporting the work in parallel to the side wall 31a such that substantially any location on the upper surface of the work 45 may be intersected by the focusing light energy for scanning same such as in the act of welding or inspecting said surface. Further means (not shown) may be provided for either moving the base 41' in a direction towards and away from the housing 36 to vary the location of the focal or intersecting point of the beam 39 in direction above the table 41.

Notation 35 refers to a vacuum pump secured to the end wall 31b of housing 31 which communicates through an opening 34 in said end wall with the interior volume 31V for removing atmospheric air therefrom. The apparatus 30 also includes one or more doors 46 for the admission and removal of work and may include conveying means (not shown) operative to transport work to and from the interior volume 31V prior to and after it has been processed as described.

The operation of the light source in housing 36, variation in its intensity and location of its focal point within the chamber 31V, and means for removing air or providing an atmosphere within the chamber and the operation of the servos for predeterminately positioning the work on table 41, may all be under the control of a single computer or cycle controller, such as a multi-circuit timer to effect preprogrammed operations on a work piece disposed within the chamber.

The apparatus of FIG. 3 may also be modified to include a plurality of windows of the type illustrated and different sources such as lasers disposed in alignment with respective of said windows for generating and directing respective beams of light energy therethrough to cooperate in scanning the same or different areas of one or more work pieces disposed within the chamber 31.

Figure 4:
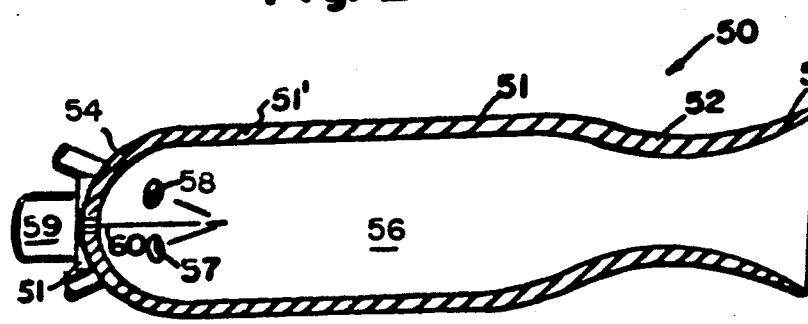
FIG. 4 is a cross sectional view of a rocket engine having externally supported means for initiating and sustaining combustion within the chamber.

FIG. 4 illustrates a liquid rocket motor 50 embodying features of the invention described. The rocket motor 50 is provided with a casing 51 having a side wall 51' which is open at one end 53 and defines an internal volume 56 in which fuel is burned and rapidly accelerated rearwardly through the throat section 52 of the casing to generate thrust. The head end 54 of the motor casing has a plurality of inlets, two of which, 57 and 58, are shown, which are defined by respective fuel nozzles mounted thereon and fed by one or more liquid propellents or fuel materials, which are ignited by an intense radiant energy such as a light beam 60 generated by a laser mounted in a housing 59 supported at the front end of the casing 51. An opening 61 in the front wall 54 of the rocket casing is either sealed by means of the housing 59 or contains a transparent window, which is sealed therein, through which a beam 60 of intense light energy is directed to the interior volume 56 and caused to intersect fuel fed through the inlets 57 and 58 to effect the ignition of same. Said fuel may be fed continuously or as a series of intermittent injections into the interior volume 56, while the laser beam 60 may be generated continuously or intermittently timed with respect to the injection of fuel to provide an optimum burning condition for a constant flow or pulsed rocket. If the inlets 57 and 58 respectively provide for the admission of ram air and a combustible fuel, the device 50 may be operative as a ram jet or pulse jet with the laser device in housing 59 operative to sustain combustion or effect the intermittent explosion of the combustible mixture to provide thrust.

Figure 5:
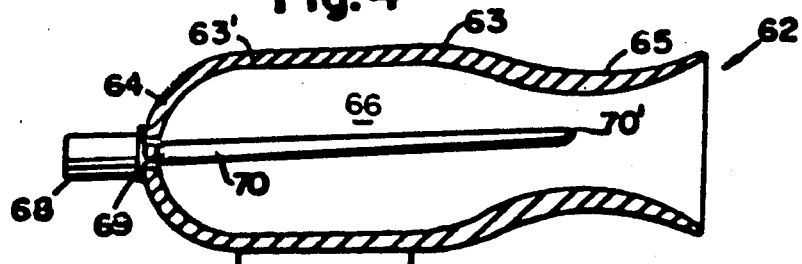
FIG. 5 is a side cross sectional view of another form of rocket motor employing externally mounted, radiant energy generating means for igniting the rocket fuel.

FIG. 5 illustrates a modified form of rocket 62 which may be a liquid or solid propellent rocket having a casing 63 defined by a side wall 63', an end wall 64, and a throat section 65 near the open end of the rocket. Mounted in a housing 68 against the end wall 64 is a laser, the output light energy of which is directed along a fiber optic bundle situated in a casing 70 which extends axially through the combustion chamber 66 to a point near the exit end of the rocket. When ignition of the solid propellent is desired, the laser 68 is suddenly energised, generating an intense pulse of light which is transmitted along the fibers of the bundle in casing or tube 70 to the end 70' thereof from which the light exits and is operative to ignite propellent immediately in front of the end of the bundle after which combustion continues by conventional burning. Notation 69 refers to a coupling means between the near end of the optical fiber bundle and the output end 70' of the laser in housing 68. It is noted that a fiber optic bundle may also be directed from a laser into the open exit end of the rocket or through the side wall thereof to ignite rocket fuel, when it is desired to generate thrust. Ignition may also occur as the result of a laser disposed beyond the exhaust end of the rocket and preferably located off the thrust axis thereof so as to locate the laser away from the direct exhaust gases.

Figure 6:
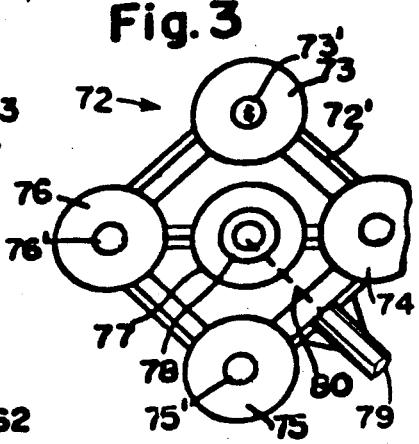
FIG. 6 is an end view of a plurality of reaction chambers and an externally mounted means for selectively directing radiant energy into said chambers.

FIG. 6 illustrates an apparatus 72 which comprises a plurality of reaction chambers, combustion chambers or rocket engines defined by notations 73, 74, 75, 76 and 77, shown provided as a cluster of four surrounding an internal chamber 77. Such chambers may also comprise piston-containing combustion chambers of an internal combustion engine, such as a gasoline or other fuel burning engine, operative to rotate a crank shaft when fuel is burned in the respective chambers in a synchronous manner to drive respective pistons coupled by piston rods to said crank shaft.

The novel essence of the invention defined in FIG. 6 comprises a means for using the intense radiation generated by one or more lasers to ignite fuel in respective cylinders or combustion chambers, either simultaneously or in a required sequence. In FIG. 6, a single laser is preferably supported by a gimball mount and is varied in attitude by means of a servo 79 having an output shaft 80 coupled to said gimball mount permit the direction of the intense light beam of the laser to be selectively directed at each of the cylinders or combustion chambers in sequence. The end walls of each of such chambers are provided with respective openings and light transmitting windows defined by notations 73', 74', 75', 76', etc. through which intense light energy may be selectively directed from the single laser 78 when properly aimed thereat as the laser is pivotally moved on its mount. Thus, explosions or reactions may be intermittently generated by pulsing and light from the laser 78 through the openings or windows in each of the cylinders in sequence. The cylinders may be arranged as in a conventional internal combustion multicylinder engine or in any other suitable arrangement, such as illustrated, to generate shaft work or thrust or to create chemical reactions in each of the cylinders. Bundles of optical fibers may also extend from a single laser 78 through the walls or the window portions of each of the cylinders 73 to 77 to simultaneously transmit light energy to each for the purposes described. A mechanical or electrical light distribution device coupled between the output of the laser and the respective fiber optic bundles may be utilized for channeling each pulse or group of pulses generated at the output of the laser to respective of the cylinders in a desired sequence.

In lieu of pivotally moving the housing for the laser as described to control the direction of the laser beam, it is noted that an electrical deflection means, or an optical device such as a mirror or prism mounted within the housing, may be pivoted or otherwie driven and utilized to deflection control the beam to cause it to scan respective of the cylinder windows or optical fiber bundles extending thereto.

Figures 7, 8, 9, 10:
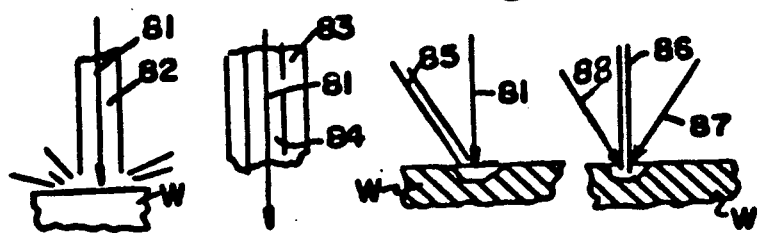
FIG. 7 is a partial side view of a radiant energy beam transmitted through a fluid stream and applicable to the apparatus of FIGS. 1-6.
FIG. 8 is a partial side view of a radiant energy beam transmitted through a tubular fluid stream.
FIG. 9 is a view of a radiant energy beam and associated fluid stream cooperating jet operating on a work piece.
FIG. 10 is a side view of a beam of radiant energy and a fluid stream intersecting a work piece and applicable to the apparatus of this invention.

FIGS. 7-10 illustrate a number of beam transmitting and fluid flow arrangements employing cooling fluids and intense radiant energy beams which are applicable to the apparatus herein described. In FIG. 7 is shown an intense radiant energy beam 81, such as that generated by a laser and directed along a liquid or fluid stream 82, which may comprise a swifty flowing gas or liquid which is operative to either shield the beam from the surrounding atmosphere, transfer heat from work and material adjacent the area intersected by the beam and/or to cooperate with the beam in performing one or more operations on a work piece. The fluid stream 82 may comprise a high velocity flow of an inert or a reactant gas, which may be operative to chemically or physically react on the material of the substrate intersected by the beam 81. Oxygen, for example, will serve to rapidly oxidize the material intersected thereby in the beam for cutting or erosion purposes. If the beam 81 is to be utilized to weld, the gas stream 82 may be an inert gas operative to protect the heated and welded portion of the work intersected thereby. The swiftly flowing molecules of the gas stream 82 may also be operable to cause the flow of substrate material which has been melted by beam 81 away from the area of the substrate intersected by the beam so as to effect the selective shaping of one or more portions of the work.

In FIG. 8, a hollow fluid stream 83 is generated to define a gaseous or vaporous interior volume 84 through which volume an intense electron or light energy beam 81 is directed. If intersected against a work piece which is adapted to be eroded or welded by means of the beam 81, the jacket of inert gas 83 may be operative to protect the area heated by the beam 81 from heat corrosion.

FIG. 9 illustrates a machining or erosion arrangement in which a beam 81 of intense light energy, such as an electron or laser beam, is directed against the surface of a work piece W. The same area the beam intersects is also intersected by a high-velocity gas or liquid jet stream 85 which may be operative to cause the flow of material, melted by the beam, away from the area intersected by the beam to cooperate with the beam in cutting, eroding, welding or otherwise reacting on the work.

Another arrangement is illustrated in FIG. 10 wherein a plurality of intense radiant energy beam, two of which 87 and 88 are shown, are generated and focused against a small area of the surface of the work W while a high-velocity stream 86 of gas or liquid fluid or particles is directed against substantially the area of the work intersected by the beam. The apparatus of FIG. 11 may be utilized for welding, cutting, erosion, test or chemical reaction purposes and the beam, as well as the stream of fluid 86 may be predeterminately controlled in intensity and scanning movement to effect a predetermined operation on the work.

The beam and fluid flow arrangements of FIGS. 7-10 may be applied to any of the herein described apparatus for the purposes of reacting on solid, liquids or gases disposed in a closed or partially closed chamber for chemical processing, inspection, testing and analysis of materials, surface erosion, cutting, welding, heat treating or otherwise processing matter. Applications of the beam-fluid arrangements shown in FIGS. 7 to 10 may include, in addition to those shown in FIGS. 1 to 6 wherein the fluid stream or streams may be generated exterior and/or interior of the reaction chamber, other arrangements as follows:

I. The fluid streams 82,83,85,87 and 88 of FIGS. 7 to 10 may contain one or more chemicals in gaseous, vaporous or solid particulate form to be deposited on that area or areas of the surface of the work piece intersected by the beam and heated or melted in a manner such that the material carried by the fluid stream either combines therewith, or is molecularly bonded or welded to the substrate upon solidification of the molten material after the beam has been moved or terminated.

II. Fluid, such as a gas, may be so heated by the beam of intense radiant energy 81 directed therethrough as to effect selected heating, burning, melting, vaporizing, softening or other operation on the work intersected by such heated fluid stream. The beams 81, 87 or 88 may be continuously or intermittently generated simultaneously with the initiation of flow of the fluid stream or between pulses of fluid stream applied to the work. In this connection, the beam may be be used to spot weld or heat treat a selected portion or portions of the substrate or work and the fluid stream may be used to cool the melted material or to prevent its heat corrosion immediately thereafter.

III. The described fluid streams may contain abrasive particles operable to erode the surface intersected thereby wherein the beam is operated to heat the surface abraded by such particles to facilitate the abrading action. If the particles are to be deposited to form a coating on the work piece, they and the work piece may be heated by the beam to facilitate and improve the coating action.

IV. Two or more streams of two or more fluids such as gases or liquids or combinations of such fluids, either one or both of which contain an intense radiation beam directed therealong, may be caused to intersect each other so as to effect chemical or molecular reactions resulting at least in part from the temperature of the radiation employed.

V. Particulate coating or deposition material may be controllably introduced into the fluid stream(s) and melted or vaporized in transit therealong to permit such material to be coated or plated onto the work or substrate intersected by the stream and/or beam. The substrate receiving same may be heated by the beam and hot fluid heated by the beam to render same molten or at a temperature high enough to facilitate or effect coating of the solid particulate or molten material carried by the beam on the substrate.

VI. Work material erosion or machining resulting from the fluid-beam arrangements of FIGS. 7 to 10 may include, in addition to cutting, boring, drilling, controlled material removal, deburring, and the softening of metal to render it easier to be machined by a cutting tool, the movement of material from one location to another on the substrate by the mechanical force of the fluid stream reacting against the softened or molten material rendered in such condition by the beam and the heated fluid.

VII. The arrangement shown in FIG. 8 may define a tubular member (83) of metal or ceramic, along the interior passageway 84 of which an intense laser beam is directed to intersect the work. Vapor of the material of the work piece, formed by the intense heat of the beam pulsed in the tubular member may be drawn through the tube by applying suction thereto and may be analyzed when so drawn off by suitable automatic analysis means. The pulsing of the beam and the application of vacuum pressure to the tube may be automatically controlled to effect a predetermined sampling and analysis.

Modifications to the apparatus described may include the elimination of light transmitting windows in the wall of the reaction chambers and their replacement with small openings in the wall of the chamber which may remain open during the operation of the apparatus or may be closed immediately after passage therethrough of the intense beam or beams of radiant energy. For example, a small opening in the wall of the reaction chambers of FIGS. 1-3, perhaps two to five times the diameter of the radiation beam, may replace the illustrated translucent windows for allowing the passage of intense laser generated light to pass from the exterior of the chamber to the interior thereof. Larger diameter openings may be provided if a valve is disposed and operates to close the opening or passageway leading thereto immediately after the pulsed beam has passed therethrough. If the opening is employed per se, the atmosphere within the chamber may be controlled by pressurizing same with suitable inert or reaction gas. Vacuum may be retained within the reaction chamber by controlling the atmosphere within the duct leading to the chamber and terminating at the wall portion containing the small opening. In certain specialized equipment and modes of operation, the reaction chamber may be closed and the intense laser or electron beam may enter said chamber by boring a small hole in the wall of the chamber to effect the desired chemical reaction. The hole may remain to accommodate and pass subsequently generated pulses of intense radiation or may be automatically sealed off by means of a suitable sealant associated with or encapsulated within the chamber wall. A subsequently generated beam may also be utilized to seal off the opening bored by the previous beam. It is also noted that gas, directed along the beam as shown in FIGS. 7 and 8, may also be employed to prevent air or other contaminating material from entering the small opening in the chamber wall during the operation of the beam. Particles directed along the gas stream and/or beam per se may also be employed to fill and close off the hole bored by the beam in the chamber wall.

Figures 11, 12:
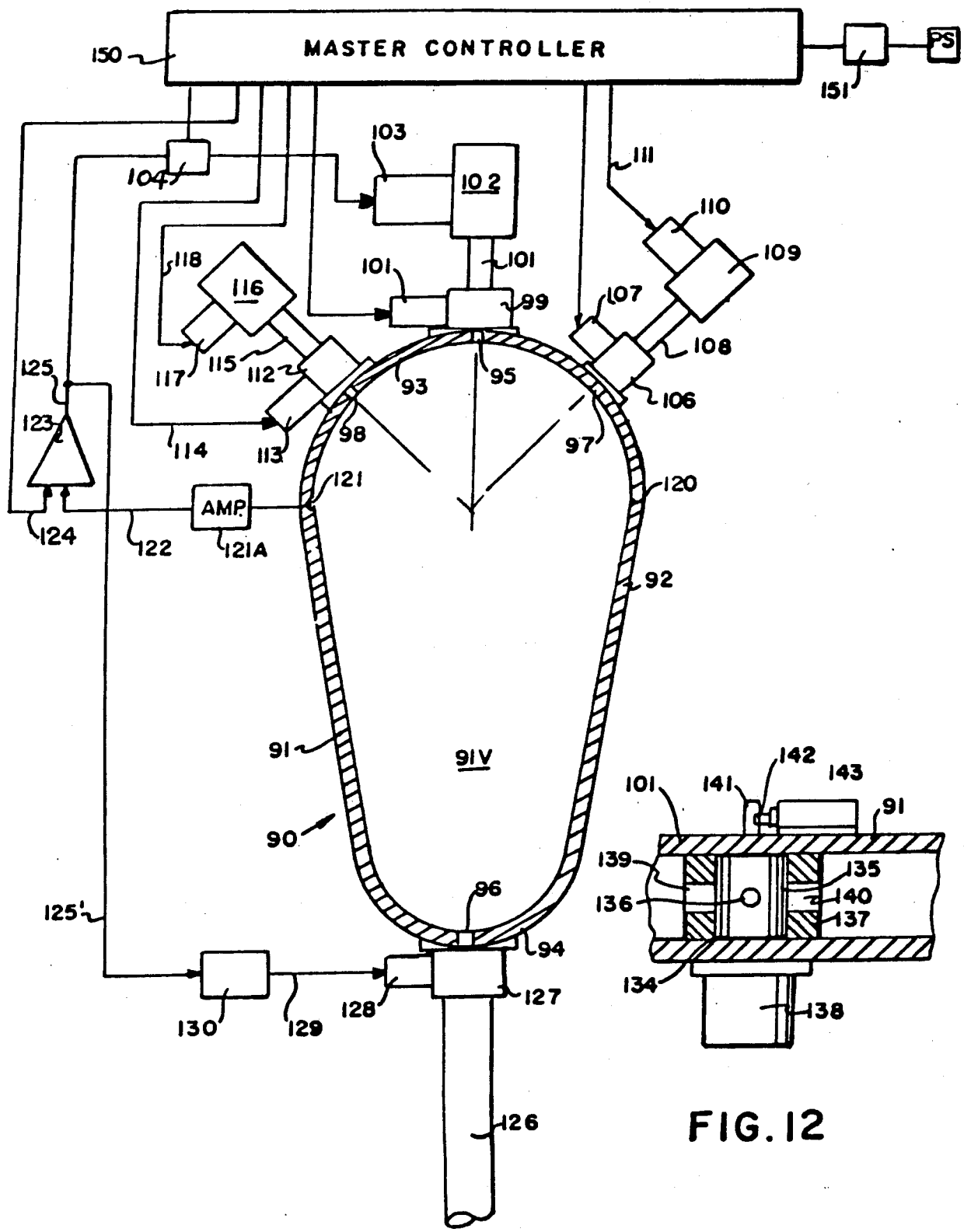
FIG. 11 is a side view with parts sectioned of a modified form of reaction apparatus and control means therefore and FIG. 12 shows a valving arrangement applicable to the apparatus of FIG. 11.

FIG. 11 illustrates further details of the instant invention including means for controlling the admission of material to a reaction chamber such as a chemical reactor or rocket engine and the generation of intense radiation for predeterminately reacting on the material admitted to perform one or more of the described functions of heating, causing chemical changes therein, generating thrust or gas at high pressure: Control means are provided in FIG. 11 which may be applied to the hereinabove described embodiments with obvious modifications without departing from the nature of the invention.

In FIG. 11, a reaction apparatus 90 includes a reaction chamber 91 having a suitable side wall 92 and end wall portions 93 and 94 preferably of spherical or bulbous configuration and made of a suitable high temperature, high strength metal, metal laminate or filament wound composite such as boron, boron nitride, boron carbide or other high strength filament reinforced metal, metal alloy, ceramic or carbon material capable of withstanding high temperature and pressure. A small window or opening 95 is provided in the end wall 93 thru which an intense radiation beam by be directed from a beam generator such as a laser or electron gun 102' located in a housing 102. The beam is directed along a tube 101 thru a valve 99 which is aligned with opening 95 and secured to the end wall 93. The valve 99 is operated by a solenoid or motor 100 to open and close intermittently under the control of a master controller 150 which generates control signals in sequence to control the variables of material admission beam generation and, if necessary, material exhaust or flow from the chamber when a start-switch 151 is closed.

Secured in alignment with a plurality of openings 97 and 98 in the chamber wall adjacent the window or opening window 95 are respective valves 106 and 112 which are operated by respective solenoids or motors 107 and 113 which are also controlled in operation by signals generated by master controller 150. Inlet ducts 108 and 115 extend from respective reservoirs 109 and 115 of liquid, gaseous, particulate or vaporous material to be flowed through ducts 108 and 115 and valves 106, 112 to the interior 91V of chamber 91, preferably along predetermined paths or streams of particle or fluid flow such that it may be detected within the chamber and/or predeterminately intersected by the beam of intense radiation. Notations 110 and 117 refer to respective motors or other electrically controlled servo devices which may be automatically controlled by signals generated on input lines 111 ad 118 extending thereto from the master controller or computer 150.

While the apparatus 90 may be operated as a rocket engine or may merely employed to generate and exhaust products of reaction through an open end thereof. Shown in FIG. 11 is an an exhaust opening 96 to the chamber 91 and a valve 127 secured to the end wall 94 in alignment with opening 96 for controlling the flow of products of reaction from the chamber. The valve 127 is controlled by a solenoid or motor 128 to open and close in accordance with control signals transmitted thereto on a circiut 129 as will be described.

The intense radiation beam generator in housing 102 is operated to intermittently generate pulses of radiation by a control 103 which may operate in accordance with the teachings of my copending applications Ser. Nos. 856,876 (abandoned) and 12,082 (abandoned) wherein a radiation beam of the desired intensity is generated thereby and directed along tube 101 through open valve 99 and into chamber volume 91V in response to a trigger signal generated on the input 104 to the beam generator trigger control 103. The trigger pulse may be generated either as a direct output signal of the master controller or computer 150 or by means of logical circuitry to be described depending on the mode of operation desired and the particular reaction parameters. In FIG. 11, a double throw switch 104 may be manually operated to connect the input 104 to the beam generator trigger control 103 either directly to an output of master controller 150 or logical switching means 123 to be described.

If the beam operated reaction occurring within chamber 91 is of such a nature that timing control means may be employed to control the admission of material to the reaction zone of the chamber and the operation of the beam generator, and removal of reaction material, then master controller 150 may comprise a multi-circuit self-recycling timer or open loop computer. However, if it is desired to fire the laser or electron gun to cause the beam to predeterminately react on a quantity of matter injected into the chamber, and variations may occur in the operation of the system, then the material injected thru either or both the inlets 97 and 98 may be sensed and detected by a device such as a photoelectric or infra-red detector 121 disposed in the wall of the chamber. Such detector 12 may be operative to generate a detection signal on its output 122 which is amplified in amplifier 121A and is applied to one input of a logical AND switching circuit 123, the other input to which has been energized by a signal generated by master controller 150 when both the inputs of circuit 123 are simultaneously energized. A signal is generated on output 125 of the AND circuit which is transmitted to activate the beam generating trigger circuit 103 of the laser 102. The valve 99, through which the laser beam is passed into volume 91V, may either have been opened by a signal generated by master controller 150 and applied to the valve servo or solenoid 100. The valve solenoid 100 may be pulsed to open by a reproduction of the signal generated on the output 125 of AND circuit 123. The characteristics of the valve 99 are such that it will remain open after being opened for a sufficient time interval to allow the pulse of radiant energy generated by laser 102 to pass therethru before it closes immediately after the passage of the beam therethrough.

The output signal of AND circuit 123 is also passed to a delay relay or delay line 130 which is preferably adjustable to cause it to generate a control signl for pulsing a solenoid 128 for operating an exhaust valve 127 disposed between chamber volume 91V and exhaust line 126 for allowing the products of reaction to controllably escape or be exhausted from the chamber. The valve 127 may also be eliminated for those applications where it is desired to cyclically exhaust material from the chamber immediately after and as a result of the direct pressure increase caused by the intense radiation of the beam and/or the resulting explosive reaction. Valve 127 is used where it is desired to increase pressure and retain reaction material in the chamber for a select time interval after one or more pulses of radiation and one or more quantities of reaction material having been injected into the chamber.

In FIG. 12 is shown further means for controlling the operation of the radiation beam generating means in accordance with the operation of a high speed valve wherein valve, operation controls the pulsing of a laser or electron gun. The valve 134 of FIG. 12 is a rotating cylinder 135 disposed in a seat 137 located between duct 101 and chamber 91 and rotated by means of a speed controlled motor 138 to align a small hole 136 extending diametrically thru the cylinder 135 with respective inlet and outlet holes 139, 140 in the valve seat. When such alignment is effected during each half revolution of the valve cylinder 137, the laser or electron gun is pulsed by a signal generated by a limit switch 141 which is actuated by a cam 142 on the shaft 141 supporting cylinder 135. The limit switch 143, shown mounted exterior of duct 101, may also be a photoelectric cell and control or proximity switch scanning suitable indicia or magnetic markers on the cylinder or motor shaft 141 to generate pulses during each half revolution of thereof which pulses are passed to the trigger control 103 of the laser or electron gun in housing 102 and may also be applied to open valves 106 and 112 by pulsing their solenoids or pump actuating means for admitting charges of one or more reaction materials from reservoirs 109 and 116.

The master controller 150 may comprise a solid state programmable electronic controller or computer fabricated of microelectronic circuitry with either a fixed or a variably programmable memory or memories which are programmed to optimize the particular reaction or reactions which take place in the volume 91V by generating control signals for controlling fuel and/or reaction fluid flow and laser operation for igniting or providing radiant energy for the purpose described.

The apparatus 90 may be employed per se or in combination with one or more other devices or systems for effecting such functions as the generation of heat for direct or indirect conversion to electrical energy and/or the performance of work, a chemical reaction per se, the incinerations of a waste material or a combination of such functions. Suitable heat transfer means, such as a water jacket or the like, may be disposed around the wall 92 of the chamber for cooling same and for transferring the heat of reaction to heat transfer apparatus such as a stream generator for operating a steam turbine or cogeneration system.

While one laser 102 is shown in FIG. 1, a plurality of suitable lasers may be mounted around the chamber 91 each being operable to generate and direct a beam of coherent radiation through a respective window in the chamber wall. An advantage of using such a laser beam generating system for effecting a chemical reaction or the combustion of fuel, is that the energy of the beam will react on and be transferred to the fluid or fluids through which the beam passes along the length of the beam passing there through, thus providing an extended path along which reaction or combustion takes place whenever the beam is generated and so directed.

Notation 102 may also refer to other means for generating or providing collimated radiation for effecting chemcial reactions and initiating combustion such as an electron gun, a molecular beam generator, a source of neutron radiation including cold neutron radiation, a source of gama radiation, a particle accelerator or a plurality of same.

Additional forms of the invention are noted as follows:

1. The apparatus 10 of FIG. 1 may be employed for the purpose of generating thrust in pulsed manner, for propulsion purposes, such as in a pulse jet or pulse rocket. In addition to creating chemical reactions involving the shock waves SW generated in the gas column 14, the combined radiation effect of the several or more beams 17', 18' and 19' which are directed to intersect a focal area or working region may also be employed to heat and weld, machine by vaporization or otherwise finish an article or surface disposed in region 14, or effect a chemical reaction or reactions with respect to one or more fluid chemicals introduced into the volume 14 of the chamber 11 as described. The several beams 17', 18' and 19' may be generated by a single laser and formed by optically splitting the single beam of the laser into several or more beams of the same or different intensities and directing each beam through a different window or opening to the chamber or through the same window or opening.

2. The apparatus of FIG. 2 may be combined with that of FIG. 3 utilizing a single laser or a plurality of lasers to both vaporize metal within an enclosed chamber and to cause such vaporour metal to become selectively deposited on a substrate or substrates, such as microelectronic circuit chips or the like disposed on the conveyor or platform 41 of FIG. 3 for fabricating microelectronic circuits. Such vaporized metal(s) may be caused to selectively deposit on the circuit substrate by means of the focused laser beam or electron beam 39 or a plurality of same.

3. An internal combustion engine employing multiple cylinders and pistons or other means for converting combustion energy into work in the manner effected by a conventional gasoline piston engine, may have fuel ignited in each cylinder by means of laser light directed through respective optical fiber bundles from a single laser, such as $CO_2$ laser to each cylinder wherein the fiber optic cable extends to the cylinder wall and terminates against or within an opening in such a wall or a window disposed therein to permit the intense light to be passed as a beam into the combustion chambers for igniting fuel therein. An optical component, such as a mirror or prism, may be operable to deflect or reflect light from the output of the laser to each of the fiber optic bundles, one at a time and in a given sequence and timed such that ignition of combustible fuel charges in each cylinder will occur to properly operate the engine at a desired efficiency. Such mirror or prism may be controlled in rotation or deflection to properly direct the pulsed output energy of the single laser into the selected cylinders or combustion chambers wherein such rotation or deflection may be timed to occur in synchronication with the driveshaft of a rotation of a shaft such as the gasoline or other fuel engine.

4. In the apparatus illustrated in FIG. 11, notations 109 and 116 may refer to respective lasers, electron guns or other type of high energy collimated beam energy generating devices operable to direct their beams at a point or focal area within the chamber 91, either continuously as a stream of fluent matter is directed from inlet 95 from a supply 103 thereof fed by means of a blower or pump 102, or intermittently to simultaneously or sequentially intersect matter at such focal area as such matter is intermittently fed through the opening or valve 95.

5. In FIG. 11 a single continuous or intermittently generated laser, electron or molecular beam passed through opening 95 in the wall of chamber 91, may be controlled and directed to intersect one or more of the streams of matter introduced through the openings 97 and 98 in the chamber wall for predeterminately reacting thereon and creating physical and/or chemical changes in the molecules or particles defining such steams of matter. Such streams of matter may be in gaseous, vaporous, plasma or solid particle form or combinations of same. The two streams may be formed of the same matter or combinations of matter or different matter and caused to chemically react or combine, such as in alloying, at or beyond the location where they intersect and/or are reacted on by the beam or beams of radiation directed thereagainst. In other words, two or more streams of matter may be caused to intersect within the chamber 91 and react when they intersect as the molecules or particles thereof are heated or irradiated by two or beams of intense radiation of the type described, whereafter the products of such reaction or reactions that occur in the chamber are continuously or intermittently removed from the chamber as described. The entire continuous or intermittent flow of fluid(s) or particles and operationn of the one or more radiation beam generators is controlled automatically by a single master controller or computer 150 as described.

6. The intense radiation beams generated by the lasers or electron gun means described above may be subject to one or more of the following modes of operation to enhance or improve the operations described. For example, conventional means, such as a servo operated or vibration imparting means may be employed to deflect a mirror or mirrors receiving laser generated radiation for controllably causing the beam to scan a select volume within the combustion chambers 11,21,51 or 91 while the beam is continuously generated during such scanning or is rapidly pulsed to caue combustion or reactions to occur at a plurality of locations within the combustion chamber or zone therein. In FIG. 1 the three beams 17',18' and 19' may be synchronously scanned and/or rapidly pulsed to rapidly effect combustion or reaction at a plurality of locations in the gas column 14. In FIG. 2 the bem 27' may be caused to scan a portion of the end of the rod or wire 29 to better vaporize same. In FIG. 3 the beam 39' may be computer controlled in its focus and/or deflection to cause it to variably vaporize or otherwise affect the surface of the work. In FIG. 11 the beam or beams described may be caused to scan and/or rapidly pulse for effecting combustion or reactions at different closely spaced or distant locations within the chamber 91 during each cycle of operation as the fuel or reactants are continuously or intermittently introduced. Since the laser beam itself does not diminish very much in intensity as it passes through the reaction chamber or chambers, if a reaction chemical or fuel is caused to flow through or fill a substantial portion of the chamber volume 91V, reaction or ignition will occur along the length or path of the beam within the portion of the chamber containing the fuel or reactant(s), thus providing an improved reaction process. A plurality of intense collimated laser beams will thus initiate ignition or effect a reaction along the path the beam travel through the fuel or reaction chemicals.

7. In a particular form of the invention, one or more lasers may be controlled to rapidly pulse in synchronization with the operation of a beam deflection control means, to provide one or more pulses of intense radiation directed at different respective locations or along different paths within the reaction or combustion chamber. If the combined pulsing and beam deflection occurs rapidly, say hundreds of times per minute or per second, since each pulse or group of pulses travel a different path, a substantial portion of the volume within the reaction chamber may be scanned and heated or irradiated by the multiple pulses directed along different select paths through the chamber, thus providing rapid and more complete reaction or combustion phenomena.

8. One or more mirrors or reflecting surfaces disposed at fixed locations within the combustion or reaction chamber may be employed to cause a single beam or a plurality of beams directed into the chamber thereat to reflect therefrom and be directed along the same or different paths through the chamber to permit the beam energy to react on different molecules of fuel or reactants existing along the different paths of the beam or beams to effect more complete and more rapid reactions and/or combustion.

9. In addition to employing lasers and electron guns for generating and directing the collimated beams of radiation for use as described above, other sources of suitable collimated radiation, such as sources of molecular beam, conventional and cold neutron energy may also be employed per se or in selected combinations thereof.

In a particular mode of operation of the apparatus described above, finely devided solid particles of a first element or chemical are introduced into a gas, vapor or plasma stream directed into a reaction shamber of the type shown in FIG. 11 and a laser beam is generated either continuously or intermittently and directed to intersect the stream of particles and operated in a manner to effect a chemical reaction between the material of the particles and the material of the fluid stream. In one form, the particle material is vaporized to effect the reaction with the fluid stream material. In another form two or more materials in solid particle form are introduced into a stream of such fluid which is thereafter intersected by the described laser beam or beams, wherein either or both the solid materials are vaporized and caused to react with each other and/or the fluid chemical defining the particle carrying stream. One or more particulate materials may also be melted in the stream by the action of the laser radiation and deposited on a select area of a substrate to form a coating thereon, a component of a microminiature electrical circuit or to effect welding of the substrate or two components which receive the molten particles. Such deposition may be accompanied by a chemical reaction between the fluid of the stream and either or both the molten particles or material of the substrate on which the particles are deposited. In addition to depositing, the operation may include machining or eroding material from the substrate.

What is claimed is:

1. Chemical reaction apparatus comprising in combination:
   (a) first means for forming a first stream of first matter and flowing said first matter in a given direction along a selected path,
   (b) second means for generating a beam of collimated coherent radiation,
   (c) third means for directing said collimated radiation beam along a path to cause it to intersect said stream of matter and to transfer sufficient energy of said beam to a quantity of said matter so as to effect a chemical change in said matter,
   (d) fourth means for controlling the conveyance of said first matter after it has undergone a reaction as a result of the transfer of energy thereto from said radiation beam to carry the products of reaction to a select location.

2. Chemical reaction apparatus in accordance with claim 1 wherein said first means is operable to direct said beam at an angle to the path said first matter is conveyed along.

3. Chemical reaction apparatus in accordance with claim 1 wherein said third means is operable to direct said beam in the direction of said first stream and parallel to the path of flow of said first matter.

4. Chemical reaction apparatus in accordance with claim 1 including fifth means for forming a second stream of second matter which is different from said first matter and causing said second stream of second matter to intersect, mix and flow with the first matter in said first stream at a location upstream of the location where said beam intersects said stream of first matter so as to permit said beam to react on the mixture of said first and second matter.

5. Chemical reaction apparatus in accordance with claim 4 including sixth and seventh means for respectively controlling the operation of said first and fifth means to control the flow of said streams of said first and second matter and master control means operable to selectively control the operation of said sixth and seventh means in effecting a chemical reaction.

6. Chemical reaction apparatus in accordance with claim 1 including fifth means for forming a second stream of second matter which is different from said first matter and causing said second stream of second matter to intersect the stream of said first matter at the location where said beam intersects said first matter so as to permit said second matter to combine with said first matter and to partake in a reaction effected by said beam of collimated radiation.

7. Chemical reaction apparatus in accordance with claim 1 including fifth means for controlling the rate of flow of said stream of said first matter, sixth means for controlling said second means to generate said beam of coherent radiation, and master control means connected to said fifth and sixth means in a manner to control the chemical reaction effected by said beam when it reacts on the matter flowing in said first stream.

8. Chemical reaction apparatus in accordance with claim 7 wherein said sixth means is operable to control said second means to cause it to generate pulses of coherent beam radiation which are intermittently directed to intersect said stream of said first matter, said master control means being operable to control the timing of the radiation pulses generated during the operation of said second means.

9. Chemical reaction apparatus in accordance with claim 1 wherein said first means is operable for forming and flowing a stream of gas defining at least part of said first matter.

10. Chemical reaction apparatus in accordance with claim 1 wherein said first means is operable to form said stream of said first matter as a gas or vapor, and dispose particles of solid matter therein to define said first stream of matter.

11. Chemical reaction apparatus in accordance with claim 1 wherein said first means is operable to intermittently form and direct matter defining said first stream along said predetermined path.

12. A method for creating a chemical reaction comprising:
   controllably directing a fluid as a stream of fluent material along a select path, which path intersects a reaction zone, so as to present molecules of said fluent material in a flow thereof through said reaction zone, and
   as said fluent material passes through said reaction zone, generating and directing a collimated beam of intense radiation along a path which intersects said reaction zone such that the radiation of said beam passes through said reaction zone while molecules of said fluid are present in said reaction zone and transferring sufficient radiation from said beam to said molecules while in said reaction zone to cause said molecules to partake in a chemical reaction while located in said reaction zone.

13. A method in accordance with claim 12 wherein said fluid is continuously flowed at a constant rate of flow to and through said reaction zone.

14. A method in accordance with claim 13 wherein said radiation beam is generated for an extended period of time while fluid is flowing through said reaction zone.

15. A method in accordance with claim 12 wherein said fluid is flowed intermittently to said reaction zone.

16. A method in accordance with claim 15 wherein said radiation beam is generated intermittently in a manner to intersect respective quantities of said flow which are intermittently flowed to said reaction zone.

17. A method for creating a chemical reaction comprising:
   (a) generating a beam of collimated radiation having sufficient intensity and energy for effecting a chemical reaction with respect to matter when said beam is caused to intersect said matter and directing said beam along a select path,
   (b) controllably flowing a stream of fluent material containing particles of matter along at least a portion of the select path along which said beam is directed, such that radiation of said beam will be transferred to particles of said matter during a substantial portion of the travel of said particles along said select path, and
   (c) causing radiation of said collimated beam to react on said particles in said stream as said particles travel said select path and to change the state of said particles and cause said particles to partake in a chemical reaction.

18. A method in accordance with claim 17 wherein said particles are solid particles of matter and said beam of collimated radiation serves to vaporize the matter of said particles, further including effecting a chemical reaction between constituents of said stream of fluent material including said vaporized material formed of said particles.

19. A method in accordance with claim 17, wherein the particles of matter in said stream are formed of different chemicals and wherein a chemical reaction is effected between said different chemicals when said radiation beam is directed against said particles of said stream.

20. A method in accordance with claim 17 wherein said radiation beam is directed through the center of said stream, said beam is deflected to scan within said stream and said beam and the fluent material of said stream are directed against the surface of a solid material and are caused to react with at least a portion of said solid material.

* * * * *

EX PARTE REEXAMINATION CERTIFICATE (4888th)
United States Patent
Lemelson

(10) Number: US 4,702,808 C1
(45) Certificate Issued: Jan. 6, 2004

(54) CHEMICAL REACTION APPARATUS AND METHOD

(75) Inventor: Jerome H. Lemelson, Metuchen, NJ (US)

(73) Assignee: Syndia Corporation, Chicago, IL (US)

Reexamination Request:
No. 90/006,451, Nov. 19, 2002

Reexamination Certificate for:
Patent No.: 4,702,808
Issued: Oct. 27, 1987
Appl. No.: 06/712,411
Filed: Mar. 15, 1985

Related U.S. Application Data

(63) Continuation-in-part of application No. 06/592,968, filed on Mar. 23, 1984, now abandoned, and a continuation of application No. 05/737,446, filed on Oct. 29, 1976, now Pat. No. 4,666,678, which is a continuation of application No. 05/165,445, filed on Jul. 26, 1971, now abandoned, and a continuation-in-part of application No. 05/012,082, filed on Feb. 17, 1970, now abandoned, which is a continuation-in-part of application No. 04/710,518, filed on Mar. 5, 1968, now Pat. No. 3,566,645, which is a continuation-in-part of application No. 04/501,395, filed on Oct. 22, 1965, now Pat. No. 3,371,404, which is a continuation-in-part of application No. 03/668,561, filed on Jun. 27, 1957, now abandoned.

(51) Int. Cl.⁷ ................................................. B01J 19/12
(52) U.S. Cl. ....................... 204/157.41; 204/157.15; 204/157.42; 204/157.61; 204/157.62; 422/186; 250/492.3
(58) Field of Search ...................... 422/186; 204/157.41, 204/157.42, 157.61, 157.62, 157.15

(56) References Cited

U.S. PATENT DOCUMENTS

| | | | |
|---|---|---|---|
| 1,700,675 A | 1/1929 | Goddard | 126/680 |
| 1,957,541 A | 5/1934 | Johnson | 123/143 |
| 2,137,598 A | 11/1938 | Vos | 102/29 |
| 2,162,996 A | 6/1939 | Dawsey | 204/31 |
| 2,217,336 A | 10/1940 | Eden | 18/5 |
| 2,287,675 A | 6/1942 | Fair et al. | 18/21 |
| 2,405,714 A | 8/1946 | Ryan | 164/93 |
| 2,463,569 A | 3/1949 | Smith | 343/100 |
| 2,471,139 A | 5/1949 | Benander et al. | 18/5 |
| 2,489,436 A | 11/1949 | Salisbury | 250/84 |
| 2,514,486 A | 7/1950 | Green | 18/5 |

(List continued on next page.)

FOREIGN PATENT DOCUMENTS

| | | |
|---|---|---|
| FR | 1022565 | 3/1953 |
| FR | 1061592 | 4/1954 |
| FR | 1240668 | 8/1960 |
| GB | 671922 | 5/1952 |
| GB | 742460 | 12/1955 |
| GB | 755903 | 8/1956 |
| GB | 774052 | 5/1957 |
| GB | 825026 | 12/1959 |
| GB | 841387 | 7/1960 |

OTHER PUBLICATIONS

Lengyel, B., *Lasers,* John Wiley & Sons, Inc., 1962, pp. 100–105 month unavailable.

*Primary Examiner*—Edna Wong

(57) ABSTRACT

This invention concerns an apparatus and method for reacting on matter, particularly to change its chemical properties and to create chemical reactions with respect to such matter by introducing the matter into a reaction chamber as one or more streams of particles, gas, liquid or plasma or a combination of such forms of matter and reacting on such matter by directing one or more beams of radiant energy, such as coherent light energy generated by a laser or a plurality of lasers wherein such radiant energy serves to initiate or complete the desired chemical reaction.

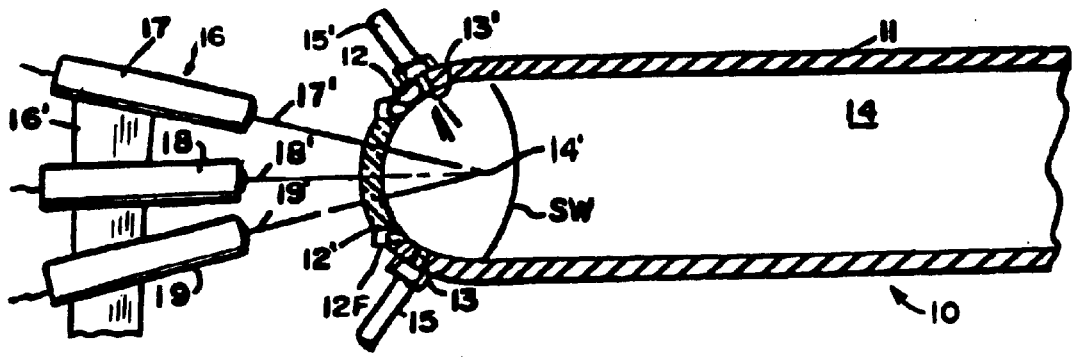

U.S. PATENT DOCUMENTS

| | | | |
|---|---|---|---|
| 2,559,227 A | 7/1951 | Rieber | 128/24 |
| 2,714,563 A | 8/1955 | Poorman et al. | 117/105 |
| 2,745,861 A | 5/1956 | Bodine, Jr. | 260/449 |
| 2,763,609 A | 9/1956 | Lewis et al. | 204/154 |
| 2,779,279 A | 1/1957 | Maiwurm | 102/26 |
| 2,793,282 A | 5/1957 | Steigerwald | 219/69 |
| 2,796,734 A | 6/1957 | Bodine, Jr. | 60/39.77 |
| 2,796,735 A | 6/1957 | Bodine, Jr. | 60/39.77 |
| 2,813,303 A | 11/1957 | Stevenson et al. | 18/20 |
| 2,823,419 A | 2/1958 | Winters et al. | 18/20 |
| 2,837,654 A | 6/1958 | Berghaus et al. | 250/49.5 |
| 2,841,687 A | 7/1958 | Richter | 219/76 |
| 2,843,542 A | 7/1958 | Callahan | 204/192 |
| 2,844,706 A | 7/1958 | Lorenz | 219/69 |
| 2,860,251 A | 11/1958 | Pakswer et al. | 250/49.5 |
| 2,861,166 A | 11/1958 | Cargill, Jr. | 219/34 |
| 2,869,825 A | 1/1959 | Crawford | 255/1.8 |
| 2,899,556 A | 8/1959 | Schopper et al. | 250/49.5 |
| 2,923,852 A | 2/1960 | Scott et al. | 315/59 |
| 2,939,049 A | 5/1960 | Blackman | 315/236 |
| 2,953,718 A | 9/1960 | Ducati | 315/163 |
| 2,958,638 A | 11/1960 | Tarmy | 204/193 |
| 2,968,723 A | 1/1961 | Steigerwald | 250/49.5 |
| 2,978,569 A | 4/1961 | Boretti et al. | 219/69 |
| 2,984,307 A | 5/1961 | Barnes | 175/2 |
| 2,994,652 A | 8/1961 | Frazer et al. | 204/157 |
| 3,009,050 A | 11/1961 | Steigerwald | 219/69 |
| 3,027,791 A | 4/1962 | Early et al. | 83/177 |
| 3,036,374 A | 5/1962 | Williams | 29/421 |
| 3,049,488 A | 8/1962 | Jackson et al. | 204/312 |
| 3,067,572 A | 12/1962 | Baumgartner | 60/25 |
| 3,089,831 A | 5/1963 | Kolb | 204/154.2 |
| 3,094,474 A | 6/1963 | Gale | 204/193.2 |
| 3,132,966 A | 5/1964 | Hughes et al. | 117/93.31 |
| 3,133,828 A | 5/1964 | Slatkin | 117/93.31 |
| 3,136,882 A | 6/1964 | Radtke | 219/117 |
| 3,156,811 A | 11/1964 | Barry | 219/121 |
| 3,160,952 A | 12/1964 | Corney et al. | 29/529 |
| 3,165,619 A | 1/1965 | Cohen | 219/121 |
| 3,177,651 A | 4/1965 | Lawrence | 60/35.3 |
| 3,179,783 A | 4/1965 | Johnson | 219/76 |
| 3,184,400 A | 5/1965 | Magnus | 204/193 |
| 3,194,047 A | 7/1965 | Eggert, Jr. et al. | 72/349 |
| 3,197,605 A | 7/1965 | Sunnen | 219/76 |
| 3,207,582 A | 9/1965 | Inoue | 23/209.1 |
| 3,219,792 A | 11/1965 | Pederson | 219/117 |
| 3,228,222 A | 1/1966 | Maier | 72/56 |
| 3,232,085 A | 2/1966 | Inoue | 72/56 |
| 3,235,955 A | 2/1966 | Kunsagi | 29/421 |
| 3,242,339 A | 3/1966 | Lee | 250/203 |
| 3,244,412 A | 4/1966 | Robinson et al. | 263/40 |
| 3,271,556 A | 9/1966 | Harris | 219/121 |
| 3,272,347 A | 9/1966 | Lemelson | 214/1 |
| 3,281,930 A | 11/1966 | Fordham | 29/470.1 |
| 3,282,100 A | 11/1966 | Baker | 73/190 |
| 3,289,447 A | 12/1966 | Amini et al. | 72/56 |
| 3,292,253 A | 12/1966 | Rossner et al. | 29/421 |
| 3,294,670 A | 12/1966 | Charschan et al. | 204/298 |
| 3,296,795 A | 1/1967 | Nielsen | 60/39.82 |
| 3,301,993 A | 1/1967 | Boyd et al. | 219/117 |
| 3,303,319 A | 2/1967 | Steigerwald | 219/121 |
| 3,346,458 A | 10/1967 | Schmidt | 176/1 |
| 3,348,814 A | 10/1967 | Shaw | 259/1 |
| 3,360,398 A | 12/1967 | Garbiotti | 117/212 |
| 3,364,087 A | 1/1968 | Solomon et al. | 156/4 |
| 3,369,101 A | 2/1968 | DiCurcio | 219/121 |
| 3,378,446 A | 4/1968 | Whittlesey | 176/1 |
| 3,389,240 A | 6/1968 | Sciaky | 219/121 |
| 3,401,249 A | 9/1968 | Schleich et al. | 219/69 |
| 3,443,087 A * | 5/1969 | Robieux et al. | 250/41.9 |
| 3,444,377 A | 5/1969 | Hora et al. | 250/84.5 |
| 3,450,858 A | 6/1969 | Pandjiris | 219/125 |
| 3,452,565 A | 7/1969 | Cadwell | 72/56 |
| 3,485,666 A | 12/1969 | Sterling et al. | 117/230 |

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 12–20 is confirmed.

Claim 1 is determined to be patentable as amended.

Claims 2–11, dependent on an amended claim, are determined to be patentable.

New claims 21–25 are added and determined to be patentable.

1. Chemical reaction apparatus comprising in combination:
   (a) first means for forming a first stream of first matter and flowing said first matter in a given direction along a selected path,
   (b) second means for generating a beam of collimated coherent radiation,
   (c) third means for directing said collimated radiation beam along a path to cause it to intersect said stream of matter and to transfer sufficient energy of said beam to a quantity of said matter so as to effect a chemical change in said matter,
   (d) fourth means for controlling the conveyance of said first matter after it has undergone a *chemical* reaction as a result of the transfer of energy thereto from said radiation beam to carry the products of *the chemical* reaction to a select location.

21. *A method in accordance with claim 12, wherein the collimated beam comprises electrons.*

22. *A method in accordance with claim 12, wherein the directing includes directing the material against the surface of a substrate to remove matter therefrom.*

23. *A method in accordance with claim 12, wherein a master controller controls one or more of the flow rate of the fluid or the generation or direction of the collimated beam.*

24. *A method in accordance with claim 23, wherein the master controller comprises a computer.*

25. *A method in accordance with claim 23, wherein a master controller comprises a multi-circuit self-recycling timer.*

\* \* \* \* \*

US004702808C2

(12) EX PARTE REEXAMINATION CERTIFICATE (5283rd)
United States Patent
Lemelson

(10) Number: US 4,702,808 C2
(45) Certificate Issued: Feb. 28, 2006

(54) CHEMICAL REACTION APPARATUS AND METHOD

(75) Inventor: Jerome H. Lemelson, Metuchen, NJ (US)

(73) Assignee: Syndia Corporation, Chicago, IL (US)

Reexamination Request:
No. 90/006,892, Dec. 19, 2003

Reexamination Certificate for:
Patent No.: 4,702,808
Issued: Jan. 6, 2004
Appl. No.: 06/712,411
Filed: Mar. 15, 1985

Reexamination Certificate B1 4,702,808 issued Oct. 27, 1987

Related U.S. Application Data

(63) Continuation-in-part of application No. 06/592,968, filed on Mar. 23, 1984, now abandoned, and a continuation of application No. 05/737,446, filed on Oct. 29, 1976, now Pat. No. 4,666,678, which is a continuation of application No. 05/165,445, filed on Jul. 26, 1971, now abandoned, and a continuation-in-part of application No. 05/012,082, filed on Feb. 17, 1970, now abandoned, which is a continuation-in-part of application No. 04/710,518, filed on Mar. 5, 1968, now Pat. No. 3,566,645, which is a continuation-in-part of application No. 04/501,395, filed on Oct. 22, 1965, now Pat. No. 3,371,404, which is a continuation-in-part of application No. 03/668,561, filed on Jun. 27, 1957, now abandoned.

(51) Int. Cl.
*B01J 19/12* (2006.01)

(52) U.S. Cl. .................. 204/157.41; 204/157.42; 204/157.61; 204/157.62; 204/157.15; 422/186; 250/492.3

(58) Field of Classification Search ............ 204/157.15, 204/157.4, 157.44, 157.6, 157.61, 157.63, 204/157.41, 157.42, 157.62; 422/186
See application file for complete search history.

(56) References Cited

U.S. PATENT DOCUMENTS

| 3,021,271 A | * | 2/1962 | Wehner | 204/192.3 |
| 3,117,022 A | * | 1/1964 | Bronson et al. | 427/526 |
| 3,245,895 A | * | 4/1966 | Baker et al. | 204/164 |
| 3,443,087 A | * | 5/1969 | Auclair et al. | 250/290 |
| 4,702,808 A | * | 10/1987 | Lemelson | 204/157.41 |

* cited by examiner

*Primary Examiner*—Edna Wong

(57) ABSTRACT

This invention concerns an apparatus and method for reacting on matter, particularly to change its chemical properties and to create chemical reactions with respect to such matter by introducing the matter into a reaction chamber as one or more streams of particles, gas, liquid or plasma or a combination of such forms of matter and reacting on such matter by directing one or more beams of radiant energy, such as coherent light energy generated by a laser or a plurality of lasers wherein such radiant energy serves to initiate or complete the desired chemical reaction.

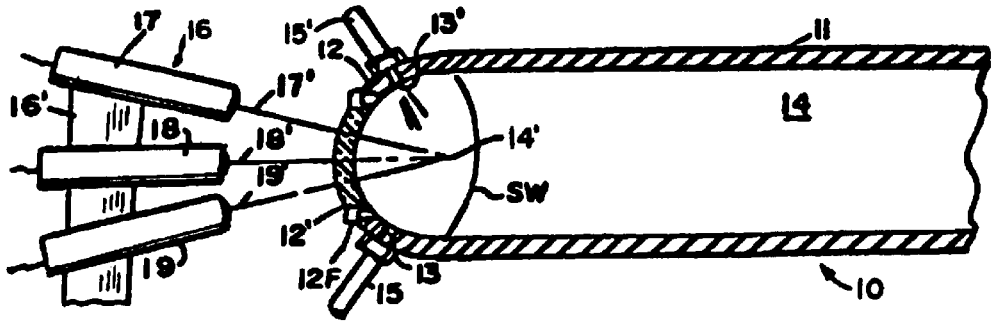

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 5, 8 and 12–25 is confirmed.

Claims 1–4, 6–7 and 9–11 are cancelled.

\* \* \* \* \*